United States Patent [19]

Nishikawa et al.

[11] 4,121,181

[45] Oct. 17, 1978

[54] ELECTRICAL BRANCHING FILTER

[75] Inventors: Toshio Nishikawa, Nagaokakyo; Yoji Ito, Takatsuki; Youhei Ishikawa; Sadahiro Tamura, both of Kyoto, all of Japan

[73] Assignee: Murata Manufacturing Co., Ltd., Nagaokakyo, Japan

[21] Appl. No.: 805,571

[22] Filed: Jun. 10, 1977

[30] Foreign Application Priority Data

Jun. 14, 1976 [JP] Japan ................................ 51-70258
Jun. 14, 1976 [JP] Japan ................................ 51-70259

[51] Int. Cl.$^2$ .............................................. H03H 9/00
[52] U.S. Cl. ................................ 333/73 R; 333/73 S
[58] Field of Search ........... 333/8, 73 C, 73 W, 73 R, 333/73 S, 83 A, 83 T, 83 R, 98 R

[56] References Cited

U.S. PATENT DOCUMENTS

| | | | |
|---|---|---|---|
| 2,510,288 | 6/1950 | Lewis et al. | 333/73 W |
| 3,500,253 | 3/1970 | Oprysko | 333/73 R |
| 3,714,605 | 1/1973 | Grace et al. | 333/73 C |
| 4,024,481 | 5/1977 | Kivi | 333/83 T |
| 4,028,652 | 6/1977 | Wakino et al. | 333/73 W |

*Primary Examiner*—Alfred E. Smith
*Assistant Examiner*—Harry E. Barlow

[57] ABSTRACT

An electrical branching filter which includes two dielectric filters each containing, in a casing of metallic material, exciting means, exciting rod member and at least one dielectric resonator disposed between said exciting means and said exciting rod member, while the exciting rod members of the two dielectric filters are connected to each other through connecting means so as to form coupling means, with input and output connectors being respectively connected to a junction between said exciting rod members and to one end of each of said exciting means.

11 Claims, 6 Drawing Figures

ELECTRICAL BRANCHING FILTER

The present invention relates to an electrical filter for use in electrical and electronic equipment and more particularly, to a branching filter employing dielectric filters to be coupled with an antenna circuit and selectively used both for transmission and reception of radio signals.

Commonly, in the field of electrical and electronic equipment, especially those for radio communication, branching filters are extensively employed to be inserted between antenna circuits and transmitters and receivers for efficient selective transmission and reception of radio signals.

Figure 1:
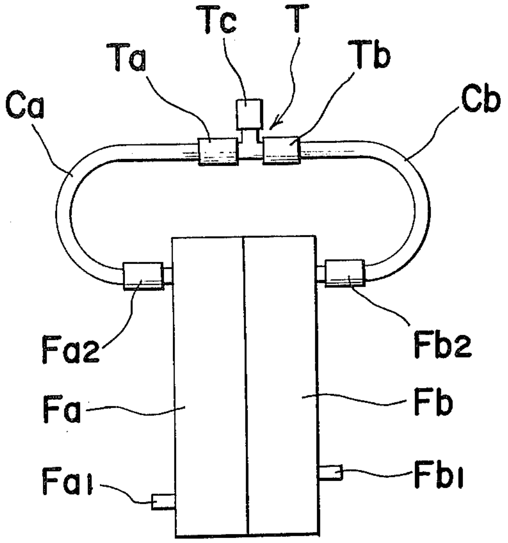
FIG. 1 Prior Art

Referring to FIG. 1, a conventional branching filter of the above described type generally includes dielectric filters F*a* and F*b* suitably connected to each other and having input and output connectors F*a*1 and F*a*2, and F*b*1 and F*b*2 respectively, and a T-shaped adaptor T having one end T*a* thereof connected to the input and output connector F*a*2 of the filter F*a* through a coaxial cord C*a* and the other end T*b* thereof connected to the input and output connector F*b*2 of the filter F*b* through a coaxial cord C*b*. An input and output connector T*c* of the adaptor T is normally coupled to an antenna (not shown), while either one of the input and output connectors F*a*1 and F*b*1 of the filters F*a* and F*b* is connected to a transmitter (not shown), with the other of the same connectors being coupled to a receiver (not shown). The phase adjustments of the known branching filter as described above are normally effected through variations of lengths of the coaxial cords C*a* and C*b*.

The conventional branching filters of the above described type, however, have various disadvantages as described hereinbelow.

(i) It is difficult to obtain a branching filter of low insertion loss due to loss arising from the coaxial cords C*a* and C*b*.

(ii) For accommodating various parts into one casing, the coaxial cords must also be housed in the same casing, thus the filter inevitably tending to be of large size.

(iii) Since the conventional branching filter includes a large number of parts with consequent complicated construction, costs involved in materials and assembling tend to be increased.

(iv) In the phase adjustments required for eliminating reflections at junctions between the filters F*a* and F*b*, it is necessary to alter the lengths of the coaxial cords C*a* and C*b* by cutting off and re-connecting such cords, thus considerable time being required for the phase adjustments. Furthermore, it is hard to achieve fine adjustment in the phase adjustments through the alteration of lengths of the coaxial cords C*a* and C*b*.

Accordingly, an essential object of the present invention is to provide a branching filter employing dielectric filter in which employment of coaxial cords is dispensed with for reduction of the insertion loss with smaller number of parts involved and consequent compact size of the branching filter on the whole.

Another important object of the present invention is to provide a branching filter of the above described type in which work involved in the phase adjustments is facilitated.

A further object of the present invention is to provide a branching filter of the above described type which is simple in construction and stable in functioning and can be manufactured at low cost.

In accomplishing these and other objects, according to one preferred embodiment of the present invention, the branching filter includes two dielectric filters each of which contains, in a casing of metallic material, exciting means or exciting rod as exciting rod means, exciting rod member and at least one dielectric resonator means disposed between said exciting means and said exciting rod member, while the exciting rod members for the two dielectric filters are connected to each other through connecting means so as to form coupling means, with input and output connectors being respectively connected to a junction between said exciting rod members, and to one end of each of said exciting means, thus employment of coaxial cords or the like being dispensed with, with substantial elimination of disadvantages inherent in the conventional branching filters.

Figure 2:
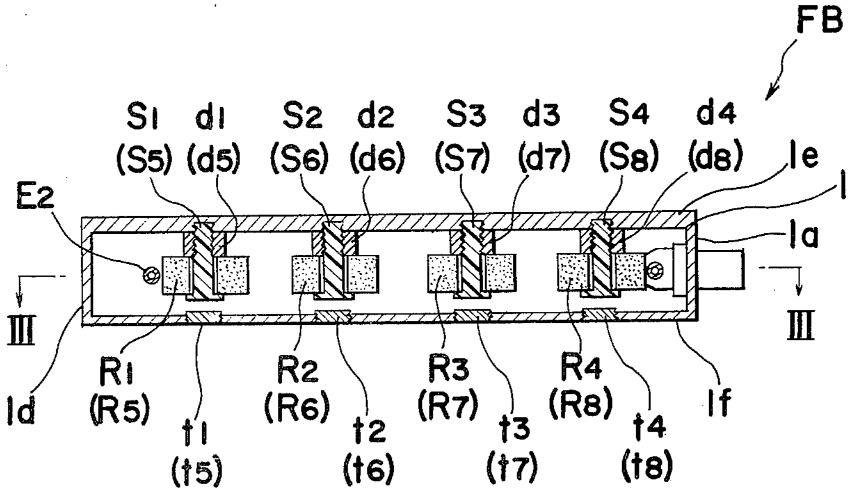
Figure 3:
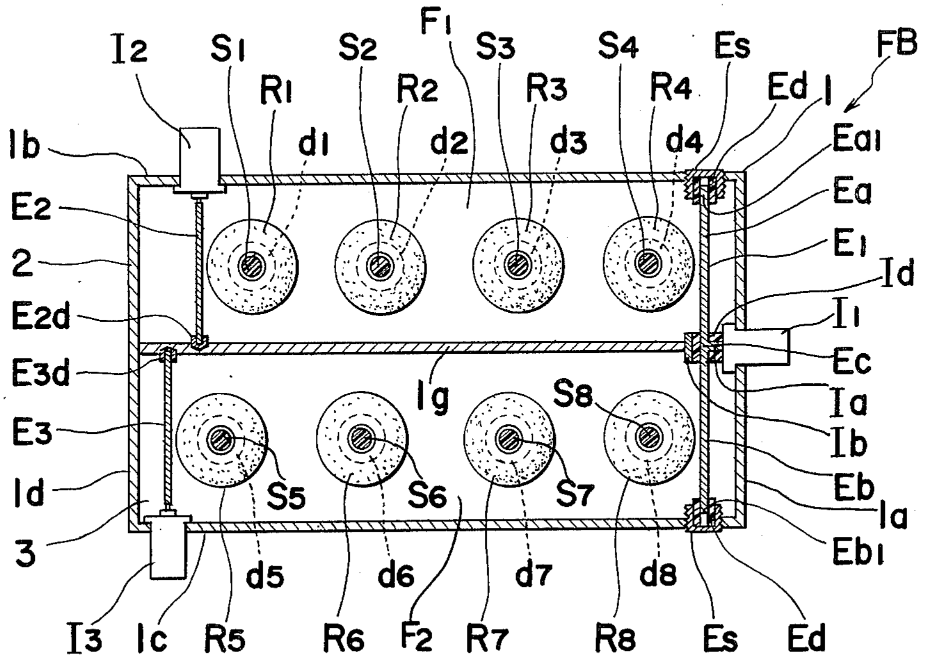
Figure 4:
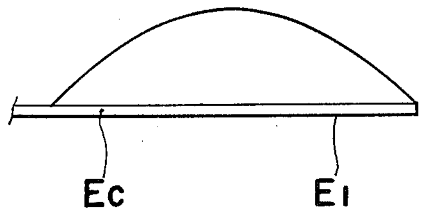
Figure 4:
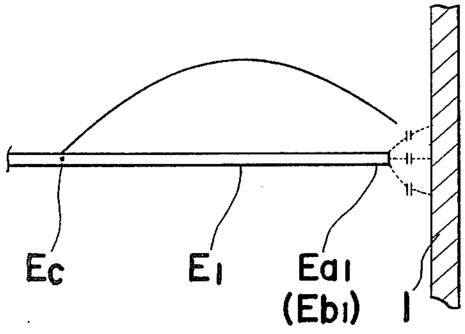
Figure 4:
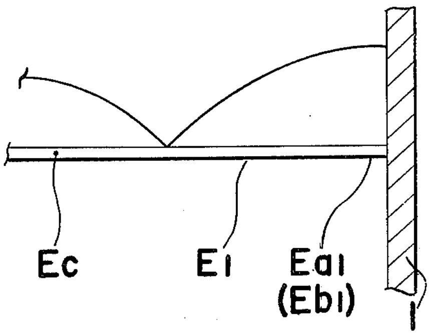

These and other objects and features of the present invention will become apparent from the following description taken in conjunction with the preferred embodiment thereof with reference to the attached drawings in which;

FIG. 1 is a schematic side elevational view of a conventional branching filter which has already been referred to, FIG. 2 is a side sectional view of a branching filter according to one embodiment of the present invention, FIG. 3 is a cross sectional view taken along the line III—III of FIG. 2, and FIGS. 4(*a*) to 4(*c*) are diagrams explanatory of relation of electrostatic capacity between free ends of exciting rods and a casing with respect to electric current level.

Before the description of the present invention proceeds, it is to be noted that like parts are designated by like reference numerals throughout the accompanying drawings.

Referring now to the drawings, there is shown in FIGS. 2 and 3 a branching filter FB according to one preferred embodiment of the present invention. The branching filter FB includes a casing 1 of electrically conductive material suitably formed into rectangular cubic configuration having side walls 1*a*, 1*b*, 1*c* and 1*d* and opposite cover walls 1*e* and 1*f*, and longitudinally divided into two chambers 2 and 3 by a partition wall 1*g* of similar conductive material which is provided at the central portion of the casing 1. In each of the chambers 2 and 3, at least one or more cylindrical dielectric resonators, for example, dielectric resonators R1, R2, R3 and R4 or R5, R6, R7 and R8 are disposed in a row in spaced relation to each other as shown in FIG. 3, and secured to one cover wall 1*e* by corresponding securing screws S1, S2, S3 and S4 or S5, S6, S7 and S8, for example, of plastic material through cylindrical insulating members *d*1, *d*2, *d*3 and *d*4 or *d*5, *d*6, *d*7 and *d*8 in a known manner. In the other cover wall 1*f* in positions corresponding to the resonators R1 to R4 and R5 to R8, frequency adjusting screws *t*1, *t*2, *t*3 and *t*4, and *t*5, *t*6, *t*7 and *t*8 are provided for frequency adjustments. In the vicinity of end portions of the chambers 2 and 3 at positions adjacent to the side wall 1*d* of the casing 1, exciting means or exciting rods E2 and E3 as exciting rod means are disposed in the widthwise direction of the casing 1, with inner ends of the rods E2 and E3 being secured to the partition wall 1*g* through insulating members E2*d* and E3*d* respectively, while outer ends of the same rods E2 and E3 are respectively connected to input and output connectors I2 and I3 secured to the side walls 1*b* and 1*c* of the casing 1. On the other hand, at the other end portions of the chambers 2 and 3 at positions adjacent to the side wall 1*a* of the casing 1, exciting rod members E*a* and E*b* are disposed in the widthwise direction of the casing 1, with inner ends of the rod members E*a* and E*b* being connected to each other at a junction E*c* in an opening formed in the partition wall 1*g*, while the opposite outer ends thereof are respectively inserted into openings formed in cylindrical dielectric members E*d* which are received in recesses of set screws E*s* threaded into the side walls 1*b* and 1*c* of the casing 1 for being fixed thereat. The exciting rod members E*a* and E*b* are directly connected, at its junction or central portion E*c* to an inner conductor I*a* of an input and output connector I1 fixedly mounted on the side wall 1*a* of the casing 1, while an outer conductor I*b* of the connector I1 which surrounds the central portion E*c* is insulated from the inner conductor I*a* by an insulating member I*d*, and thus, the inner and outer conductors I*a* and I*b* of the input and output connector I1 and the insulating member I*d* form connecting means of the exciting rod members E*a* and E*b* to form a single exciting rod member, i.e., coupling means E1 with respect to the exciting rod means E2 and E3. It should be noted here that the exciting rod members E*a* and E*b* described as formed separately for connection at the junction E*c* may be preliminarily formed as a single exciting rod member for connection of the connecting means to its intermediate point E*c*. The capacity between each of outer ends E*a*1 and E*b*1 of the rod members E*a* and E*b* and the casing 1 is formed, through the dielectric members E*d*, between the screws E*s* and the outer ends E*a*1 and E*b*1 of the exciting members E*a* and E*b*. In the above arrangement, a first dielectric filter F1 is constituted by the exciting rod means E2, dielectric resonators R1 to R4 and the portion E*a* of the exciting rod member E1 in the chamber 2, while a second dielectric filter F2 is formed by the exciting rod means E3, dielectric resonators R5 to R8 and the portion E*b* of the exciting rod member E1, with phase adjustments or matching being made in such a manner that the impedance of the second filter F2 as viewed from the central point E*c* of the exciting rod member E1 reaches an infinite value with respect to the passing frequency *f*1 of the first filter F1, and that of the first filter F1 as viewed from the same point E*c* reaches an infinite value with respect to the passing frequency *f*2 of the second filter F2. Accordingly, signal whose frequency is *f*1 is transmitted from the exciting rod means E2 to the input and output connector I1 through the dielectric resonators R1 to R4 and the first portion E*a* of the exciting rod member E1 or vice versa, while signal whose frequency is *f*2 is also transmitted from the exciting rod means E3 to the connector I1 through the resonators R5 to R8 and the second portion E*b* of the exciting rod member E1 or vice versa, and thus, for example, if the input and output connector I1 inputs and outputs the signals of frequencies *f*1 and *f*2, the input and output connector I2 inputs and outputs the signal of frequency *f*1 only, and the input and output connector I3 inputs and outputs the signal of frequency *f*2 only.

More specifically, the matching as mentioned above is nothing but to cause the current distribution of an undesired signal at the exciting rod member E1 in the filter, through which the signal is not desired to pass, to become zero at the portion E*c*. In other words, in FIG. 3, for a signal having a passing frequency *f*1, the filter F2 is regarded as one through which the signal is not desired to pass, and therefore, for matching, the current distribution of the signal of frequency *f*1 applied to the rod E*b* is rendered to be zero at the portion E*c*, so that the signal of frequency *f*1 is prevented from passing through the filter F2. On the contary, for a signal having a passing frequency *f*2, the filter F1 is regarded as one through which the signal is not desired to pass, and accordingly, for matching, the current distribution of the signal of frequency *f*2 is made to be 0 at the point E*c* in order to prevent the signal of frequency *f*2 from passing through the filter F1. The phase adjustment as described above may be effected by adjusting the screws E*s* for the exciting rod member E1 or by alteration of dielectric constant $\epsilon$ of the cylindrical dielectric members E*d*, or through variation of length or thickness of the exciting rod member E1. In actual practice, however, rough phase adjustment is first made by properly selecting the length and thickness of the exciting rod member E1 according to various other requirements before assembling of the branching filter, while fine adjustment after assembling is effected by varying the electrostatic capacity between the outer ends E*a*1 and E*b*1 of the exciting rod member E1 and the casing 1 through selective tightening and loosening of the adjusting screws E*s* for the exciting rod member E1.

Referring also to FIGS. 4(*a*) to 4(*c*) showing relation between the electrostatic capacity and current level of signals, FIG. 4(*a*) represents the state wherein the exciting rod member E1 is arranged to be free, i.e., wherein the casing 1 is dispensed with, FIG. 4(*b*) illustrates the state wherein a certain degree of capacity is present between the outer ends E*a*1 and E*b*1 of the exciting rod member E1 and the casing 1, and FIG. 4(*c*) represents the state wherein the outer ends E*a*1 and E*b*1 of the rod member E1 are brought into contact with the casing 1. As is clear from FIGS. 4(*a*) to 4(*c*), it is possible to alter the phase at the central point or junction E*c* of the exciting rod member E1 by variation of the capacity in the earlier described manner. Accordingly, the phase adjustments, i.e., elimination of reflection at the point E*c* of the exciting rod member E1 can readily be effected through extremely simple method of varying the capacity by the screws E*s* or other suitable means. Meanwhile, the range for the phase adjustments can be set to any desired extent through variation of dielectric constant $\epsilon$ of the dielectric members E*d* for the exciting rod member E1 or by eliminating such dielectric members depending on necessity.

It should be noted here that in the foregoing embodiment, the dielectric members E*d* described as employed are not necessarily required, while the adjusting screws E*s* may be replaced by other suitable means having similar effect so far as such other means is capable of varying the capacity between the outer ends E*a*1 and E*b*1 of the exciting rod member E1 and the casing 1.

It should also be noted that the input and output described in the foregoing embodiment as applied to or developed from the input and output connectors connected to the connecting means and to one end of each of said exciting rods as exciting means may be modified to be directly applied to or developed from the connecting means and the one end of each of said exciting rods.

It should further be noted that the exciting rods members E2 and E3 described as employed in the foregoing embodiment may be replaced by known waveguide coupling means if coupling is made with respect to a waveguide (not shown).

It is needless to say that the casing 1 described as formed into one unit in the above embodiment with the partition wall 1g provided therein may be replaced by a pair of casings to be coupled through the coupling means, i.e., the exciting rod member E1.

As is clear from the foregoing description, according to the present invention, since the branching filter includes two dielectric filters each containing, in a casing of metallic material, exciting means, exciting rod member and at least one dielectric resonator disposed between said exciting means and said exciting rod member, while the exciting rod members for the two dielectric filters are connected to each other through connecting means so as to form coupling means, with input and output connectors being respectively connected to a junction or intermediate point between said exciting members and to one end of each of said exciting means, the coaxial cords employed in the conventional arrangement are advantageously eliminated, with consequent reduction of the insertion loss and overall size of the branching filter, while the small number of parts involved and simple construction thereof are effective for reducing the cost of the branching filter. Furthermore, by the arrangement according to the present invention wherein the electrostatic capacity between the outer ends of the exciting rod members and the casing is adapted to be variable, fine adjustment of the phase can be effected precisely through the extremely simple method.

Although the present invention has been fully described by way of examples in connection with the preferred embodiment thereof, it should be noted that various changes and modifications are apparent to those skilled in the art. By way of example, the electrical branching filter according to the present invention can be used not only in the microwave band-pass filter, but also in any other microwave filters such as microstrip filters and waveguide filters which employ the electrical branching filter constructed as included in the present invention.

What is claimed is:

1. An electrical branching filter for use in electrical and electronic equipment which comprises a first dielectric filter and a second dielectric filter each having, in housing means of metallic material, exciting means, exciting rod member and at least one dielectric resonator means disposed between said exciting means and said exciting rod member, said exciting rod member for said first and second dielectric filters being connected to connecting means so as to form coupling means, with input and output being applied to and developed from said connecting means at intermediate portion between said exciting rod members and one end of each of said exciting means.

2. An electrical branching filter as claimed in claim 1, wherein said housing means is a casing member divided by a partition wall into two casing members each for accommodating therein said exciting means, exciting rod member and dielectric resonator means.

3. An electrical branching filter as claimed in claim 1, wherein said housing means is two casing members each having said exciting means, exciting rod member and dielectric resonator means accommodated therein.

4. An electrical branching filter as claimed in claim 1, wherein said exciting means is a first exciting rod disposed adjacent to one end of each of said casing members and connected, at its one end, to said input and output.

5. An electrical branching filter as claimed in claim 1, wherein said exciting rod member is a second exciting rod disposed adjacent to the other end of each of said casing members and connected to each other at said intermediate portion which is a junction between said second rod members through said connecting means so as to form said coupling means, with said input and output being applied to and developed from said connecting means.

6. An electrical branching filter as claimed in claim 1, wherein said exciting rod member is a second single exciting rod disposed adjacent to the other end of said housing means to extend into said two casing members and connected, at said intermediate portion, to said connecting means so as to form said coupling means, with said input and output being connected to said connecting means.

7. An electrical branching filter as claimed in claim 1, wherein said input and output is applied to and developed from said connecting means and said one end of each of said exciting means through input and output connector means connected to the latter.

8. An electrical branching filter as claimed in claim 1, wherein said branching filter is so constructed that capacity between outer ends of said exciting rod member remote from said connecting means and said housing means is variable for phase adjustment.

9. An electrical branching filter as claimed in claim 8, wherein said phase adjustment is effected by adjusting, for the capacity variation, screw members threaded into said casing member to receive, in openings thereof, said outer ends of said exciting rod member through cylindrical dielectric members accommodated in said openings of said screw members.

10. An electrical branching filter as claimed in claim 8, wherein said phase adjustment is effected by altering dielectric constant of cylindrical dielectric members accommodated in openings of screw members threaded into said casing member to receive said outer ends of said exciting rod member.

11. An electrical branching filter as claimed in claim 8, wherein said phase adjustment is effected by selectively altering length and thickness of said exciting rod member forming said coupling means together with said connecting means.

* * * * *